United States Patent
Pagenkopf

(10) Patent No.: US 11,456,101 B2
(45) Date of Patent: Sep. 27, 2022

(54) ADJUSTABLE INDUCTOR AND METHOD OF USING THE SAME

(71) Applicant: Hubbell Incorporated, Shelton, CT (US)

(72) Inventor: Kenneth Edward Pagenkopf, Shorewood, WI (US)

(73) Assignee: Hubbell Incorporated, Shelton, CT (US)

( * ) Notice: Subject to any disclaimer, the term of this patent is extended or adjusted under 35 U.S.C. 154(b) by 168 days.

(21) Appl. No.: 16/903,703

(22) Filed: Jun. 17, 2020

(65) Prior Publication Data

US 2020/0403595 A1    Dec. 24, 2020

Related U.S. Application Data

(60) Provisional application No. 62/862,985, filed on Jun. 18, 2019.

(51) Int. Cl.
| | |
|---|---|
| *H01F 21/04* | (2006.01) |
| *H01F 27/28* | (2006.01) |
| *H03H 7/01* | (2006.01) |
| *H01F 27/24* | (2006.01) |

(52) U.S. Cl.
CPC .......... *H01F 21/04* (2013.01); *H01F 27/24* (2013.01); *H01F 27/28* (2013.01); *H03H 7/0115* (2013.01); *H03H 2210/026* (2013.01)

(58) Field of Classification Search
CPC .... H03H 7/0115; H03H 1/0007; H01F 21/04; H01F 27/28; H01F 27/24
USPC ........................................ 333/175, 181, 185
See application file for complete search history.

(56) References Cited

U.S. PATENT DOCUMENTS

| | | | | |
|---|---|---|---|---|
| 3,471,815 | A | * | 10/1969 | Grant ...................... H01F 29/10 336/83 |
| 5,949,664 | A | * | 9/1999 | Bernet .................. H02M 7/521 363/37 |
| 6,738,612 | B1 | | 5/2004 | Imbornone et al. |
| 6,842,086 | B1 | * | 1/2005 | Zennamo, Jr. ....... H03H 7/0153 333/175 |
| 9,870,854 | B1 | | 1/2018 | Patterson |
| 10,102,952 | B2 | | 10/2018 | Pagenkopf |
| 2001/0026205 | A1 | | 10/2001 | Paris et al. |
| 2013/0187712 | A1 | | 7/2013 | Cabanillas et al. |
| 2015/0318097 | A1 | | 11/2015 | Pagenkopf |

OTHER PUBLICATIONS

PCT/US2020/038072 International Search Report and Written Opinion dated Nov. 20, 2020.

* cited by examiner

*Primary Examiner* — Rakesh B Patel
(74) *Attorney, Agent, or Firm* — Michael Best & Friedrich LLP

(57) ABSTRACT

An adjustable inductor including a toroidal core defining a plurality of gaps, a compressible gap material positioned in the gaps, at least one winding wound on the core, a force-applying structure, and a film substantially covering the adjustable inductor. The force-applying structure is operable to apply a force to the core to adjust the gaps and thereby an inductance of the adjustable inductor. The film is configured to prevent movement of force-applying structure when above a predetermined temperature threshold, and allow movement of the force-applying structure when below the predetermined threshold.

12 Claims, 8 Drawing Sheets

ADJUSTABLE INDUCTOR AND METHOD OF USING THE SAME

RELATED APPLICATIONS

This application claims priority to U.S. Provisional Patent Application No. 62/862,985, filed Jun. 18, 2019, the entire contents of which are hereby incorporated by reference.

FIELD

Embodiments relate to adjustable inductors.

SUMMARY

Inductors, such as but not limited to toroidal inductors, may have a predetermined, set inductance that may not be adjusted in the field. For example, such toroidal inductors may only be adjusted by adding or removing turns or repositioning wires on the core after winding.

Adding and removing turns can result in only integer changes of value—inductance is proportional to turns squared. Repositioning windings can have negligible effect and is not easily repeatable. Normally, an inductor of, for example, ±3% tolerance requires careful gapping and/or material selection, consistent winding turns and/or positions, and/or may need addition or removal of turns. Many times the part cannot attain the needed value and must be scrapped or disassembled and rewound.

Adjustable inductors, such as those described in U.S. Pat. No. 10,102,952 (hereby incorporated by reference), may be adjusted in the field. As a result of being able to be adjusted while in the field, an adjustable inductor may have a variety of applications.

For example, one embodiment provides an adjustable inductor including a toroidal core defining a plurality of gaps, a compressible gap material positioned in the gaps, at least one winding wound on the core, a force-applying structure, and a film substantially covering the adjustable inductor. The force-applying structure is operable to apply a force to the core to adjust the gaps and thereby an inductance of the adjustable inductor. The film is configured to prevent movement of force-applying structure when above a predetermined temperature threshold, and allow movement of the force-applying structure when below the predetermined threshold.

Another embodiment provides a tunable trap filter inductor including an adjustable inductor and a capacitor. The adjustable inductor includes a toroidal core defining a plurality of gaps, a compressible gap material positioned in the gaps, at least one winding wound on the core, and a force-applying structure operable to apply a force to the core to adjust the gaps and thereby an inductance of the adjustable inductor. The capacitor is in a series-type electrical connection with the adjustable inductor.

Yet another embodiment provides a three-phase matched filter inductor including a first adjustable toroidal inductor having a first variable inductance, a second adjustable toroidal inductor having a second variable inductance, and a third adjustable toroidal inductor having a third variable inductance. Wherein the first, second, and third variable inductances are matched after production of the first, second, and third adjustable toroidal inductors.

Other aspects of the application will become apparent by consideration of the detailed description and accompanying drawings.

DETAILED DESCRIPTION

Figure 1:
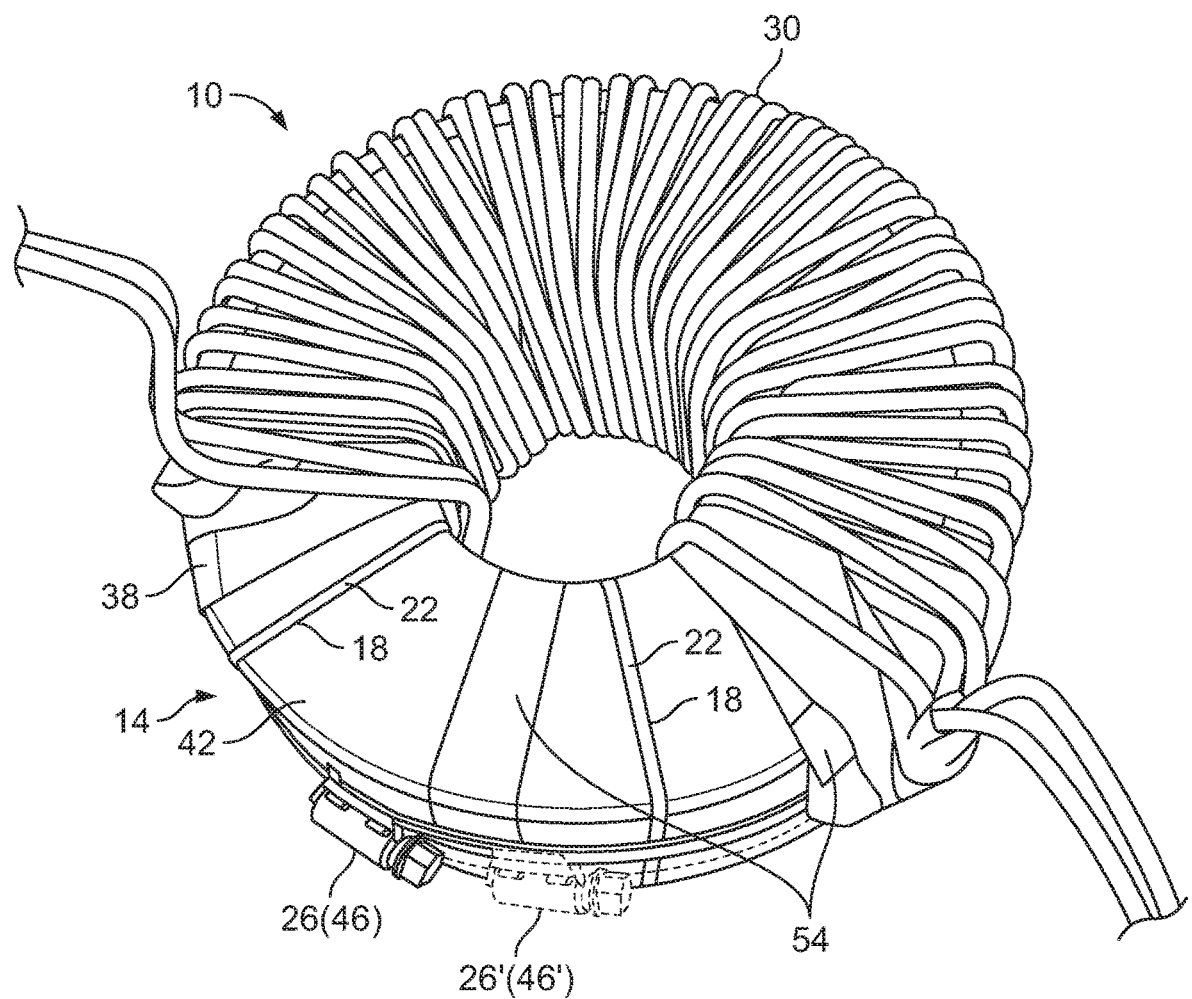
FIG. 1 is a perspective view of an adjustable inductor according to some embodiments.
Figure 2:
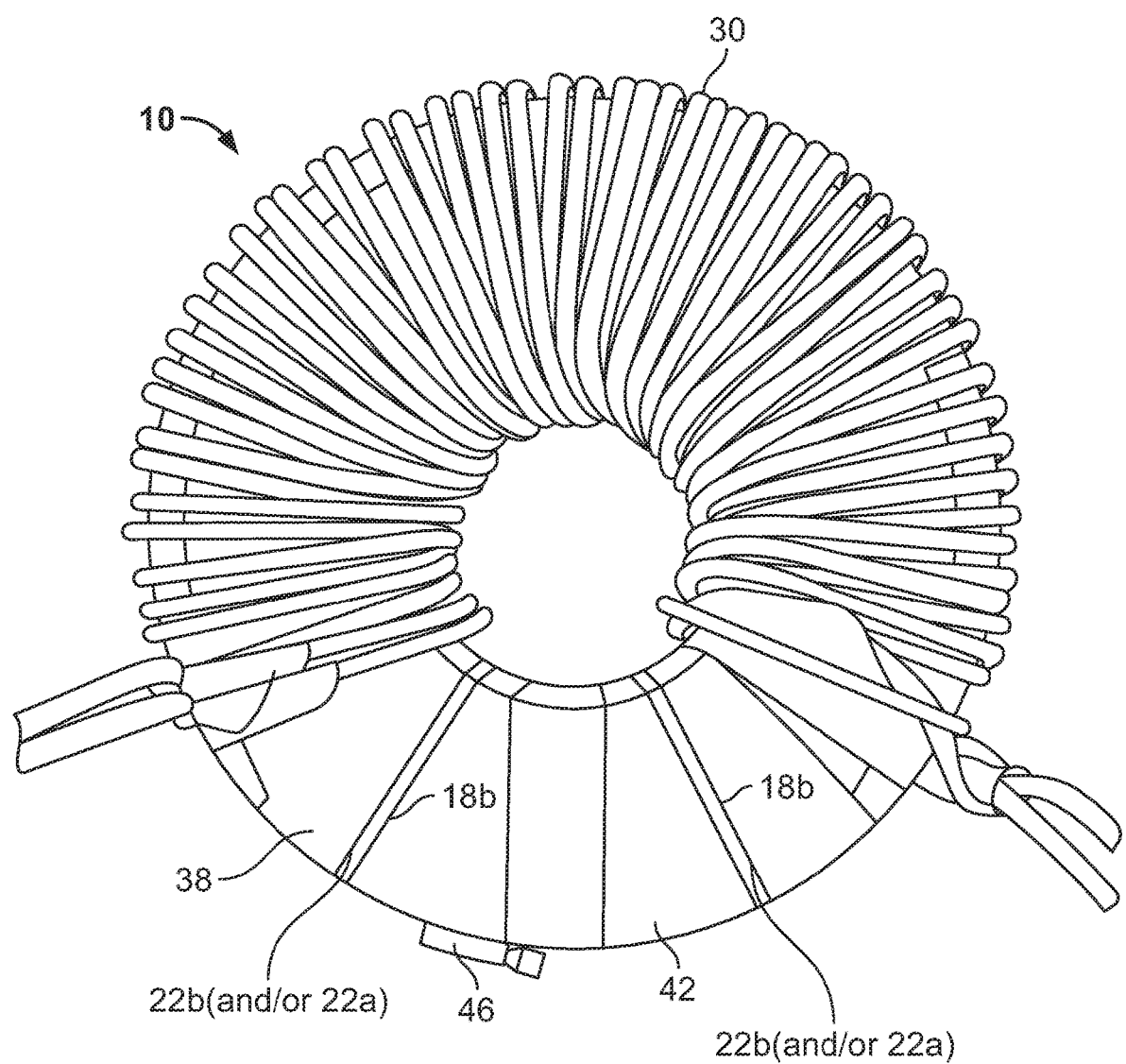
FIG. 2 is a top view of the inductor shown in FIG. 1 according to some embodiments.

Before any embodiments of the application are explained in detail, it is to be understood that the application is not limited in its application to the details of construction and the arrangement of components set forth in the following description or illustrated in the following drawings. The application is capable of other embodiments and of being practiced or of being carried out in various ways.

The phrase "series-type configuration" as used herein refers to a circuit arrangement in which the described elements are arranged, in general, in a sequential fashion such that the output of one element is coupled to the input of another, though the same current may not pass through each element. For example, in a "series-type configuration," additional circuit elements may be connected in parallel with one or more of the elements in the "series-type configuration." Furthermore, additional circuit elements can be connected at nodes in the series-type configuration such that branches in the circuit are present. Therefore, elements in a series-type configuration do not necessarily form a true "series circuit."

Additionally, the phrase "parallel-type configuration" as used herein refers to a circuit arrangement in which the described elements are arranged, in general, in a manner such that one element is connected to another element, such that the circuit forms a parallel branch of the circuit arrangement. In such a configuration, the individual elements of the circuit may not have the same potential difference across them individually. For example, in a parallel-type configuration of the circuit, two circuit elements in parallel with one another may be connected in series with one or more additional elements of the circuit. Therefore, a circuit in a "parallel-type configuration" can include elements that do not necessarily individually form a true "parallel circuit."

An electrical component, such as a toroidal inductor 10, and a method of assembling the inductor 10 are illustrated in FIGS. 1-6. The illustrated inductor 10 is adjustable to adjust its inductance. The inductor 10 generally includes (see FIGS. 1-2) a core 14 defining a number of gaps 18, gap material 22 positioned in the gaps 18, force-applying structure 26 (e.g., a hose clamp) to adjust the gap(s) 18, and a wound coil 30.

In the illustrated construction, the core 14 has a toroidal shape and defines at least two gaps 18 (four gaps 18 shown in FIGS. 3-4) to provide core pieces 34 (four core pieces 34, two of about 120° each and two of about 60° each). In other constructions (not shown), the core 14 may be formed in different angular sections (e.g., four 90° core pieces 34) and/or with fewer or more gaps 18 (e.g., six 60° core pieces 34).

The illustrated core 14 is formed by winding strip steel (e.g., M3, M6, M50, or other grade) which is spot welded and annealed. The layers of the core 14 are held together, for example, by varnish. The core 14 is then cut to provide the desired number of gaps 18.

In other constructions (not shown), the core 14 may be formed of different materials (e.g., amorphous sheet, iron powder, Sendust powder, etc.) and/or by different processes (e.g., molding, casting, etc.). In such constructions, the core 14 may be formed (e.g., molded, compressed and fired) with the desired gap(s) 18.

Figure 3:
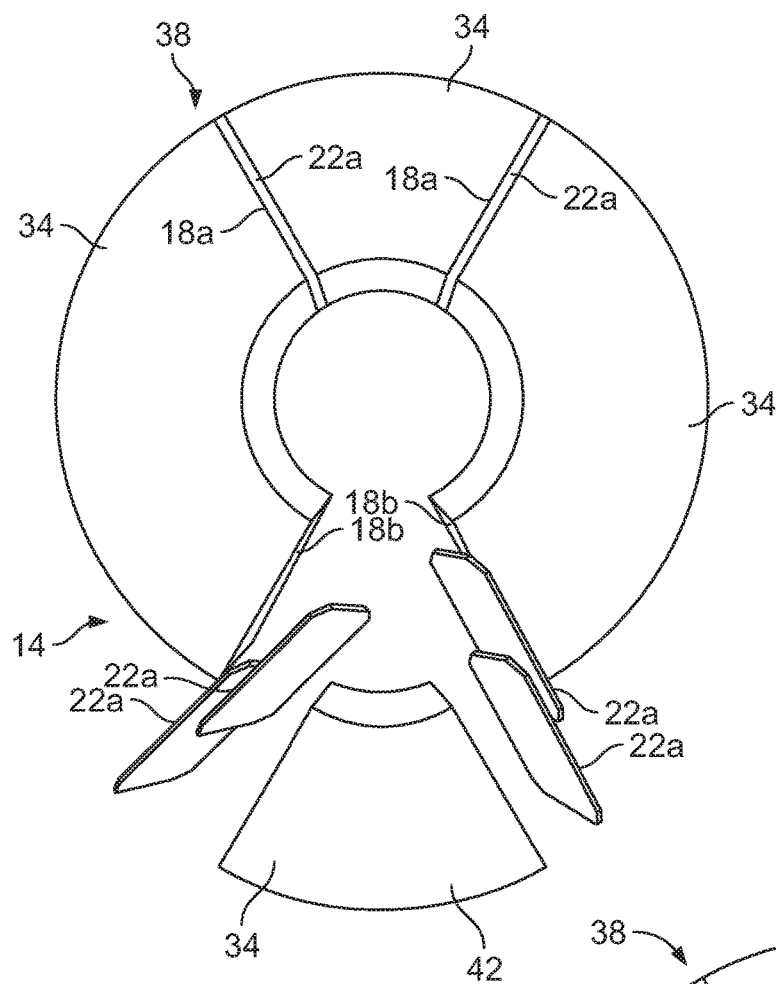
FIG. 3 is a top view of a core of the inductor partially assembled with gap material according to some embodiments.
Figure 4:
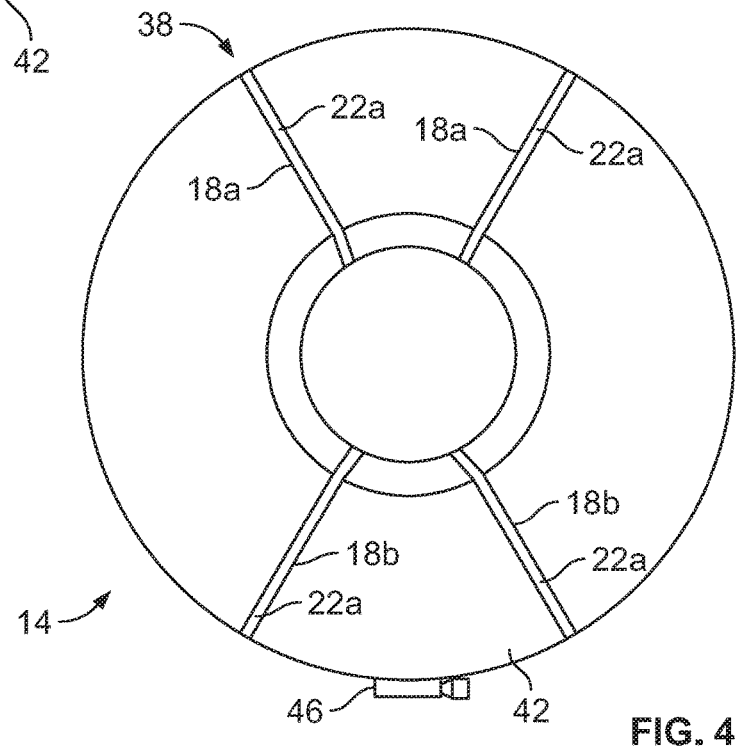
FIG. 4 is a top view of the core assembled with gap material and a clamp according to some embodiments.
Figure 5:
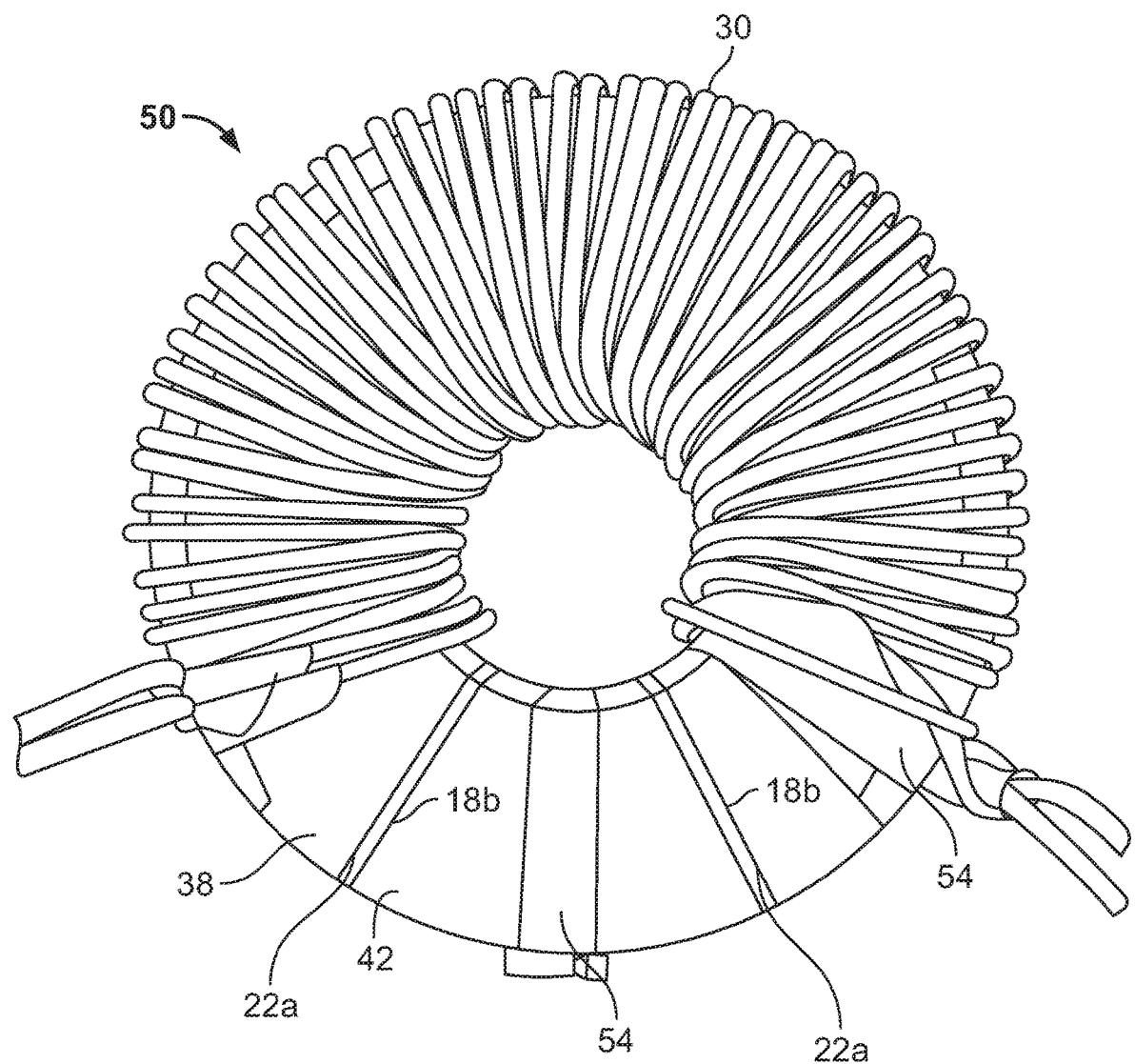
FIG. 5 is a top view of the wound core according to some embodiments.
Figure 6:
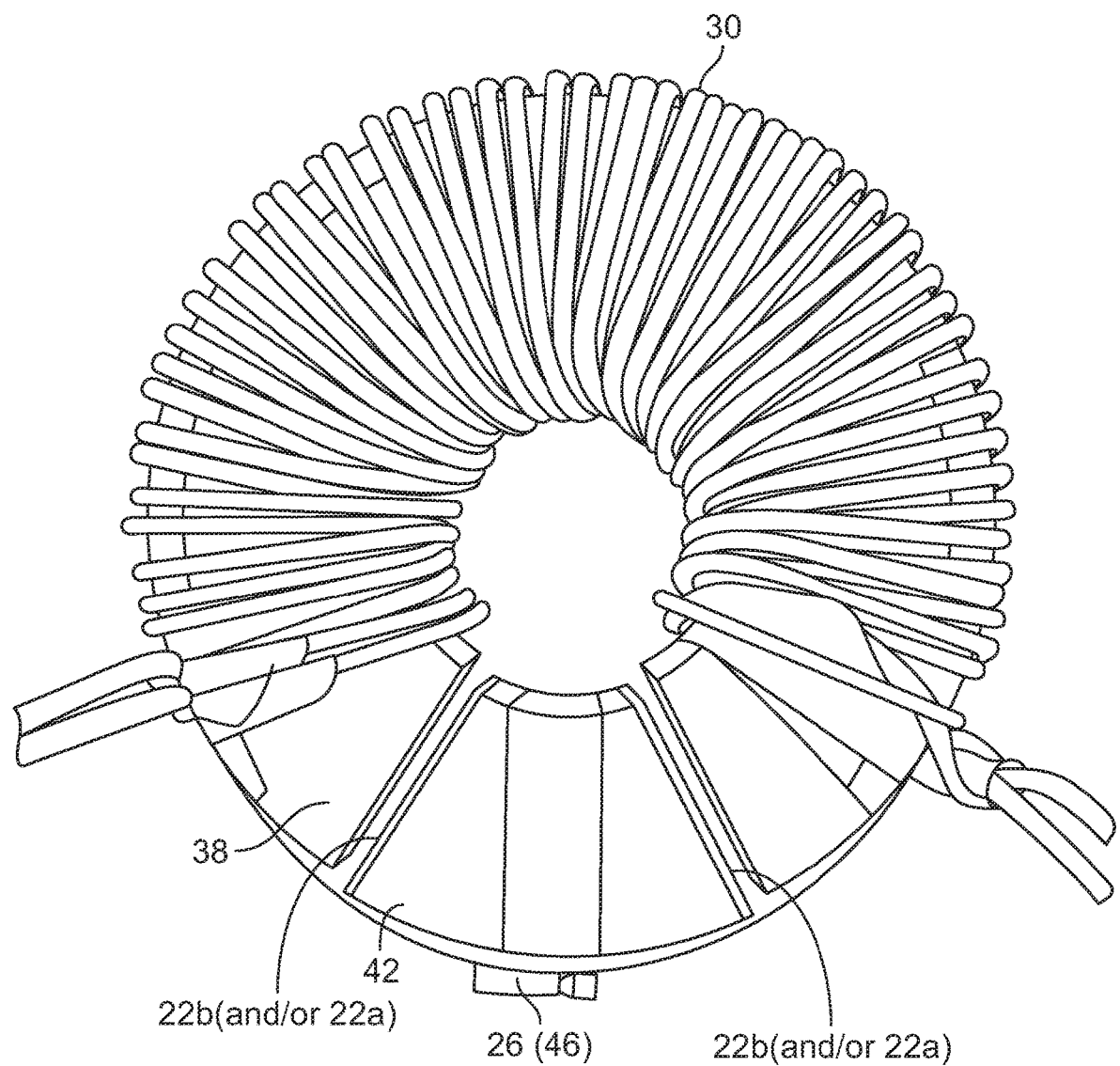
FIG. 6 is a top view of the wound core with a removable core section partially removed according to some embodiments.

As shown in FIGS. 3-4, gap material 22 is positioned in each of the gaps 18. The gap material 22 may be substantially non-magnetic and not electrically conductive. The gap material 22 may also withstand magnetic temperatures (maximum temperatures in the range of about 130° C. to about 220° C.) and may perform to cold temperatures (as low as about −55° C.).

Substantially incompressible "rigid" gap material 22a (e.g., high temperature gapping material used in magnetics (glass epoxy, Glastic® (available from Rochling Glastic Composites, L. P., Cleveland, Ohio), GPO fiberglass epoxy, Nomexx paper (available from DuPont, Wilmington, Del.), circuit board material, etc., glass, treated paper, and combinations thereof)), may be placed in fixed gaps 18a (e.g., gaps 18 which are not to be adjustable) (see FIGS. 3-4). In the illustrated construction, the thickness of gap material 22a in the fixed gaps 18a is selected to establish a basic inductance and an inductance adjustability range of the inductor 10.

For holding purposes during assembly, rigid gap material 22a is positioned in the adjustable gaps 18b. Compressible "soft" gap material 22b (e.g., silicone sheet, silicone foam, high temperature soft rubber, etc. and combinations thereof) may later be provided in the adjustable gap(s) 18b (see FIGS. 2 and 6).

A rigid core section 38 is formed by fixing rigid gap material 22a in place (e.g., with high temperature glue) between a number of separated pieces 34 (e.g., three pieces 34) of the core 14. Rigid gap material 22a is also removably positioned (e.g., unglued; see FIGS. 3-4) in the gaps 18b during assembly (e.g., through winding) and may be used, alone or in combination with soft gap material 22b, in the final adjustable gap(s) 18b.

The core 14 is assembled of one or more rigid core sections 38 and at least one removable core section 42. In the illustrated construction (see FIGS. 3-4), the core 14 includes a rigid core section 38 extending about 300° (e.g., three core pieces 34 of about 120°, 60° and 120°) and a removable core section 42 extending about 60°. In other constructions (not shown), the core sections 38, 42 may subtend a different angle (e.g., about 270° and about 90°, respectively).

In some illustrated constructions (see, e.g., FIGS. 1-2 and 6), the force-applying structure 26 includes a clamp 46 (e.g., a hose clamp) positioned at least partially around the core 14 (e.g., around the circumference of the core 14). The clamp 46 may be non-magnetic (e.g., stainless steel, aluminum, etc.) and generally holds the sections 38, 42 of the core 14 together. When tightened (see FIGS. 1-2), the clamp 46 is operable to apply a force (e.g., a radial force) to the removable section 42 of the core 14 to adjust the gap(s) 18b.

In the illustrated construction, the force-applying structure 26 includes only one clamp 46. In other constructions, more than one clamp 46 (e.g., two (an additional force-applying structure 26'/clamp 46' is shown in phantom in FIG. 1), three or more) may be provided. As shown in FIG. 1, the actuating portions of the force-applying structures 26, 26' (the clamps 46, 46') are illustrated circumferentially-spaced apart but, in other constructions (not shown), may be circumferentially-aligned.

In other constructions (not shown), the force-applying structure 26 may include another mechanism, such as a radially-oriented screw (e.g., a thumb screw) supported on a circumferential band, applying a radial force to the removable section 42. In other constructions (not shown), the force-applying structure 26 may include a cable tie, a tie strap, banding material applied by a banding machine, etc.

The wound coil 30 includes (see FIGS. 1-2 and 5-6) one or more windings 50 wound onto the rigid core section 38 but not onto the removable core section 42. The windings 50 may include wire that is coated with film, Teflon® (available from DuPont), other material withstanding magnetic temperatures, glass wound, etc. Each winding 50 has a desired number of turns, strands of wire (e.g., a single strand, multiple strands), etc. In the illustrated construction, the coil 30 includes dual windings 50. The number of core pieces 34 and the relative sizes of the core sections 38, 42 may be determined based on the desired size of the coil 30 on the rigid core section 38.

Prior to winding, the rigid core section 38 may be wrapped (with tape 54), dipped, epoxy, other coating, etc., to be electrically insulated. In the illustrated construction, the removable core section 42 is wrapped with one or more strips of tape 54 separately from the rigid core section 38.

With the core sections 38, 42 held rigidly by the clamp 46 (to withstand wrapping forces), the windings 50 are wound, in the illustrated construction (see FIG. 5), only onto the rigid core section 38 with the desired number of turns. In other constructions (not shown), the windings 50 may be wound onto a portion of the removable core section 42.

After winding, the clamp 46 is loosened (see FIG. 6), and the rigid gap material 22a in at least one of the gaps 18b (both adjustable gaps 18b in the illustrated construction) is replaced with soft gap material 22b (see FIG. 2) or a combination of soft and rigid gap materials 22b, 22a. The clamp 46 is tightened to set a low end of adjustment of the gap(s) 18b and of the inductance.

The clamp 46 is adjusted (e.g., tightened to increase the inductance, loosened to decrease the inductance) to radially move the removable core section 42 to adjust the gap(s) 18b (in the illustrated construction, both gaps 18b may be adjusted) and, thereby, adjust the inductance of the inductor 10 to the desired value. In the illustrated construction, the inductance of the inductor 10 can be adjusted in a range of 10% of the inductance value. This range of adjustment can be changed with a different size of the adjustable gap(s) 18b, amount or compressibility of the compressible gap material 22b, etc.

In an alternative construction, the adjustable gap(s) 18b can be adjusted with only rigid gap material 22a. After winding, the thickness of rigid gap material 22a in the adjustable gap(s) 18b is changed to change the inductance.

The thickness (the number of sheets and/or thickness of each sheet of rigid gap material 22a) is changed until the desired inductance is achieved.

Figure 7:
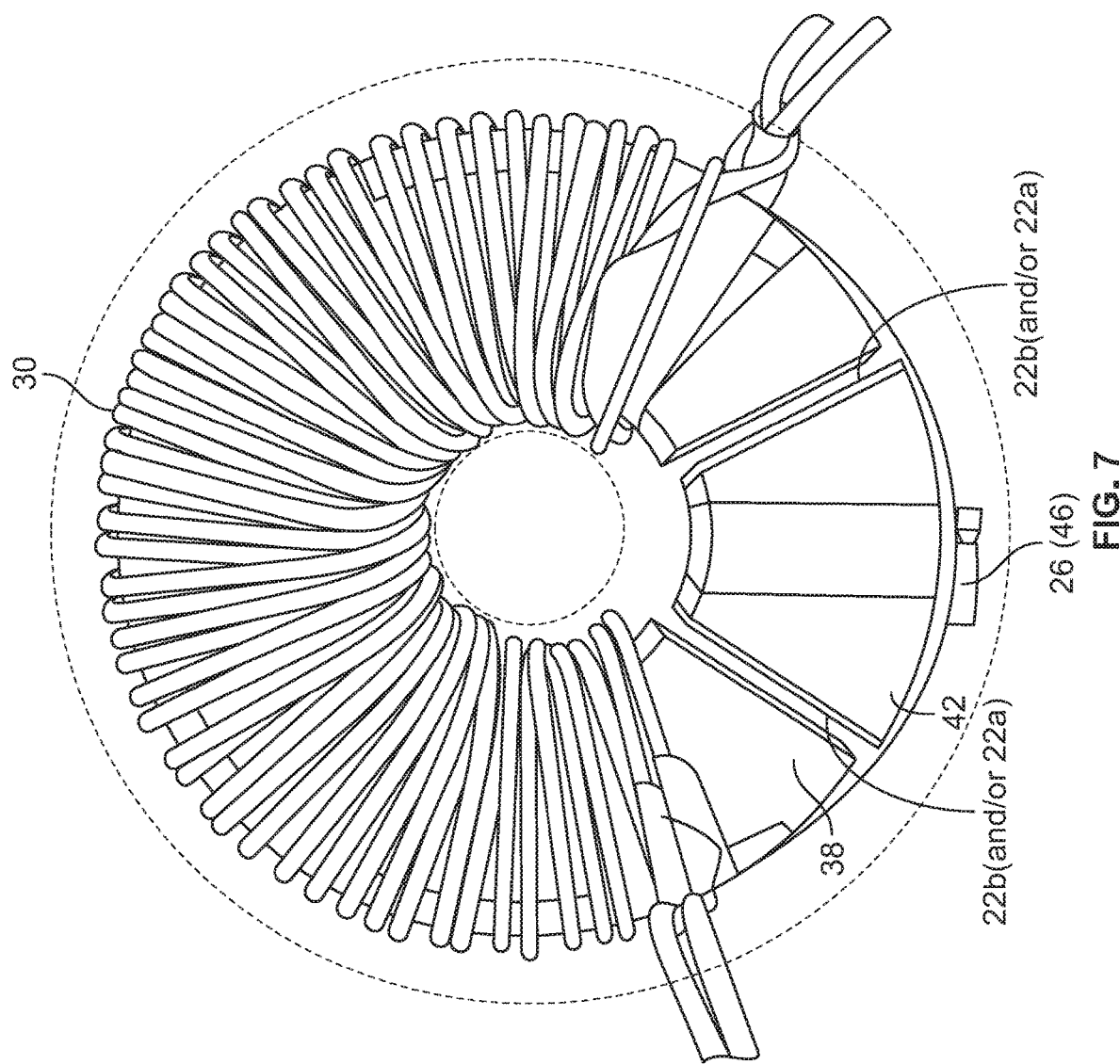
FIG. 7 is a top view of the inductor shown in FIG. 1 including a film according to some embodiments.

As illustrated in FIG. 7, the inductor 10 may be, at least partially, encased by a finish or film (illustrated by dotted line 60). In some embodiments, the film may be a varnish. In operation, the film is configured to prohibit movement of the force-applying structure 26, and thus prohibit adjustment of the inductance of the inductor 10, when below a predetermined temperature threshold. When heated to a temperature above the predetermined temperature threshold, the film may soften enough to allow movement of the force-applying structure 26, and thus allow adjustment of the inductance of the inductor 10. It should be understood that, in other embodiments, the inductor 10 may not undergo finishing, and such an inductor 10 would remain adjustable during use.

Figure 8:
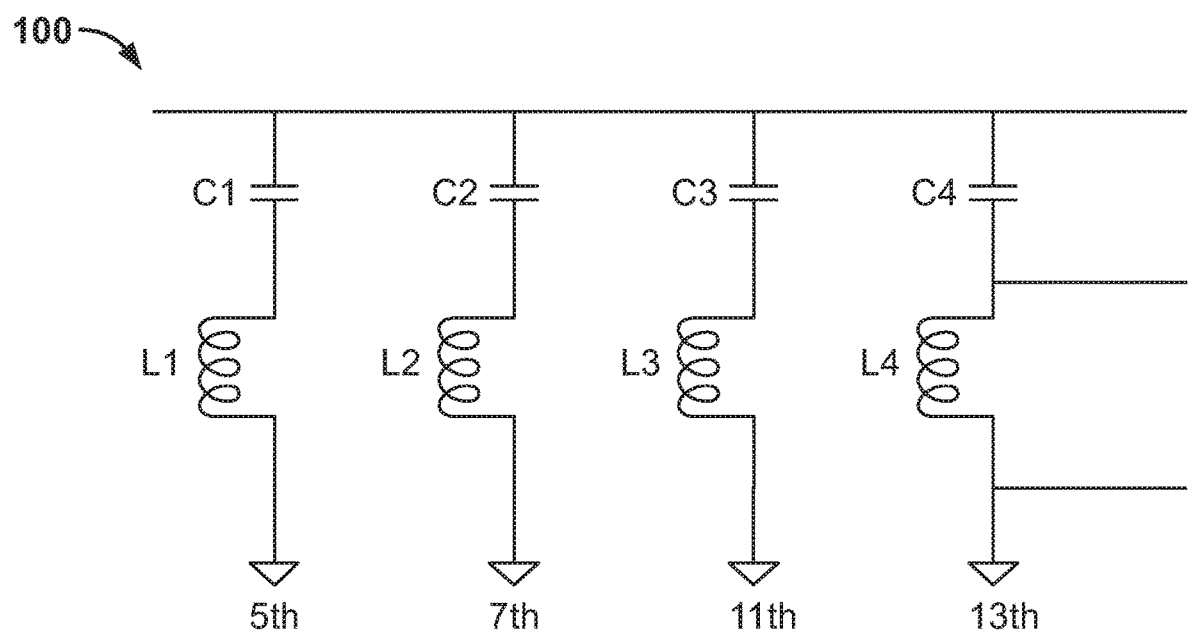
FIG. 8 is a circuit diagram of a tunable trap filter incorporating one or more inductors as shown in FIG. 1 according to some embodiments.

FIG. 8 is a circuit diagram illustrating a tunable trap filter 100 incorporating one or more inductors 10 according to some embodiments. As illustrated, the tunable trap filter 100 may include one or more capacitors C1-C4, each respectively electrically connected in a series-type connection with inductors L1-L4. The capacitor and inductors pairs may then be electrically connected in a parallel-type connection with each other. In the illustrated embodiment, inductors L1-L4 each have a similar construction to inductor 10 described in detail above.

Incorporating inductors 10 into the tunable trap filter 100 may allow for each inductors L1-L4 to be tuned in accordance with expected harmonics. For example, expected harmonics of the $5^{th}$, $7^{th}$, $11^{th}$, and $13^{th}$, as well as others dependent on the phase connections.

As a result of inductors L1-L4 being able to be adjusted in the field, the inductors L1-L4 may be paired with capacitors C1-C4 and tuned to a correct resonant frequency not only for the inductance value, but also to adjust for variations in capacitance, allowing for individually tuned sections.

Furthermore, capacitors used in trap filters may age and lose capacitance value. This may result in the de-tuning of the trap filter making its frequency move up and away from its intended value. Such a de-tuning may significantly reduce the attenuation of the filter at the intended trap frequency, as well as shift the center frequency of the filter away from its intended frequency and into a frequency area that may have resonant peaks thereby creating a resonant circuit that can cause severe ringing and potential damage to the filter components. By incorporating adjustable inductors L1-L4 into the tunable trap filter 100, the frequency may be corrected without the need to replace capacitors, thus reducing down time.

Figure 9:
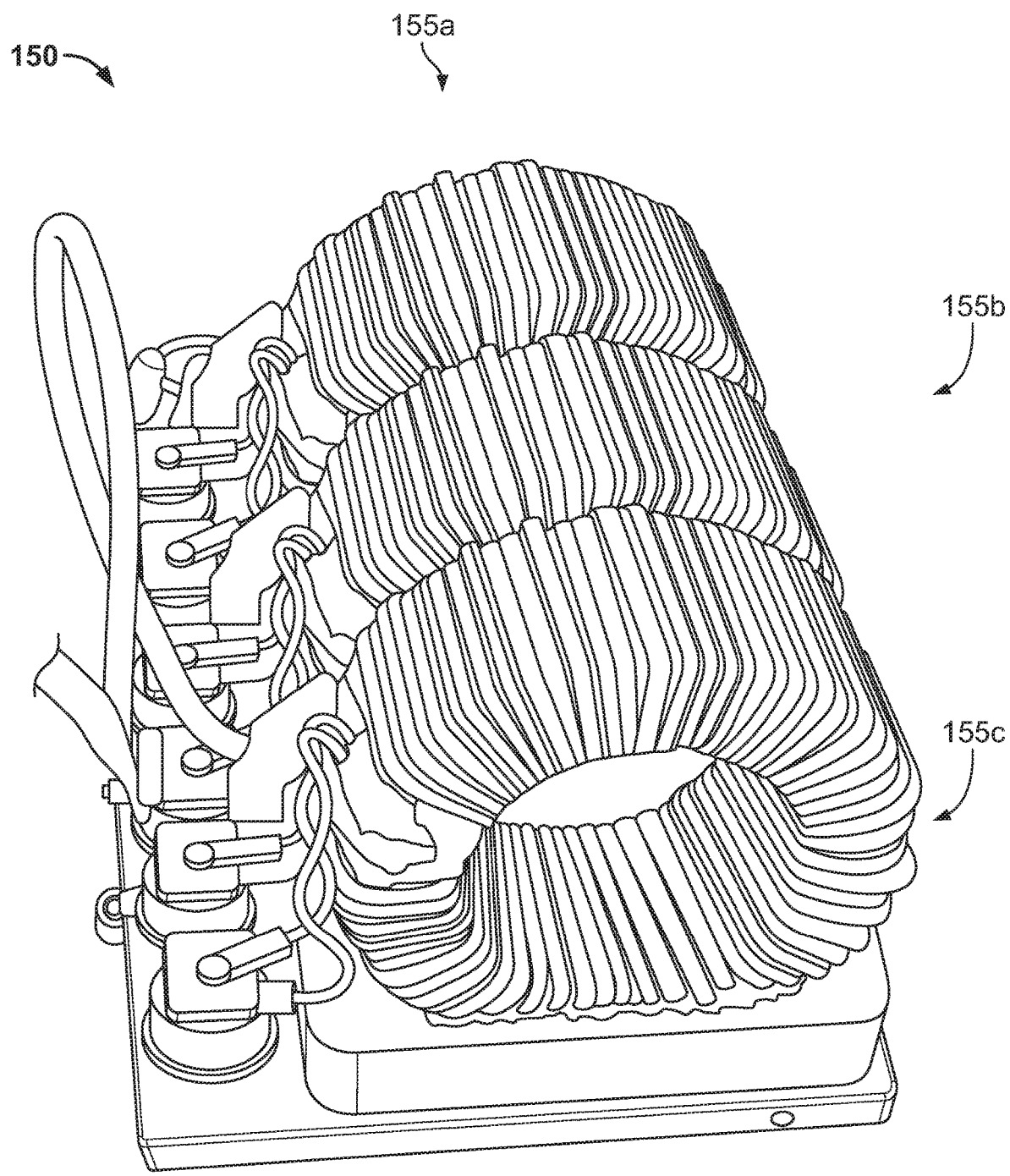
FIG. 9 is a perspective view of a three-phase matched filter inductor incorporating one or more inductors as shown in FIG. 1 according to some embodiments.

FIG. 9 illustrates a three-phase matched filter inductor 150 according to some embodiments. As illustrated, the three-phase matched filter inductor 150 may include inductors 155a-155c. In the illustrated embodiments, inductors 155a-155c each have a similar construction to inductor 10 described in detail above (for example, inductors 155a-155c may be adjustable inductors).

Incorporating inductors 155a-155c into the three-phase matched filter inductor 150 allows for matching of the inductors 155a-155c in the field, without extensive rework. For example, inductors 155a-155c may be adjusted after the windings are positioned, thereby eliminating the need to unwind and wind the windings.

During production of fixed inductors for use in three-phase matched filter inductors, each inductor is grouped together based on matching cores. However, magnetic properties developed during winding can vary according to the position of the windings, the size of the gap between the start and finish windings, if more than one strand of wire is used, and the relative positions of each turn of each strand of wire. Such a change in inductance value derived from winding properties may results in inductors having matched cores to become unmatched when installed in the field. The three-phase matched filter inductor 150 solves these deficiencies by allowing for inductors 155a-155c to be adjusted in the field.

Embodiments provide, among other things, an adjustable inductor. Various features and advantages of the application are set forth in the following claims.

What is claimed is:

1. An adjustable inductor comprising:
   a toroidal core defining a plurality of gaps;
   a compressible gap material positioned in the gaps;
   at least one winding wound on the core;
   a force-applying structure operable to apply a force to the core to adjust the gaps and thereby an inductance of the adjustable inductor; and
   a film substantially covering the adjustable inductor, the film configured to
     prevent movement of the force-applying structure when above a predetermined temperature threshold, and
     allow movement of the force-applying structure when below the predetermined threshold.

2. The adjustable inductor of claim 1, wherein the predetermined threshold is approximately 150° C.

3. The adjustable inductor of claim 1, wherein the film is a varnish.

4. A tunable trap filter inductor comprising:
   an adjustable inductor including
     a toroidal core defining a plurality of gaps;
     a compressible gap material positioned in the gaps;
     at least one winding wound on the core;
     a force-applying structure operable to apply a force to the core to adjust the gaps and thereby an inductance of the adjustable inductor; and
   a capacitor in a series-type electrical connection with the adjustable inductor;
   wherein the adjustable inductor further includes a film substantially covering the adjustable inductor.

5. The tunable trap filter of claim 4, wherein the inductance of the adjustable inductor is adjusted based on a variation of a capacitance of the capacitor.

6. The tunable trap filter of claim 4, wherein the film is a varnish.

7. The tunable trap filter of claim 4, wherein the film is configured to
   prevent movement of force-applying structure when above a predetermined temperature threshold, and
   allow movement of the force-applying structure when below the predetermined threshold.

8. The tunable trap filter of claim 7, wherein the predetermined threshold is approximately 150° C.

9. A three-phase matched filter inductor comprising:
   a first adjustable inductor having a first variable inductance;
   a second adjustable inductor having a second variable inductance; and
   a third adjustable inductor having a third variable inductance;
   wherein the first, second, and third variable inductances are matched after production of the first, second, and third adjustable inductors;
   wherein the first adjustable inductor includes a toroidal core defining a plurality of gaps;
a compressible gap material positioned in the gaps;
at least one winding wound on the core; and
a force-applying structure operable to apply a force to the core to adjust the gaps and thereby the first variable inductance; and
wherein the first adjustable inductor further includes a film substantially covering the first adjustable inductor.

10. The three-phase matched filter inductor of claim 9, wherein the film is configured to
prevent movement of force-applying structure when above a predetermined temperature threshold, and
allow movement of the force-applying structure when below the predetermined threshold.

11. The three-phase matched filter inductor of claim 10, wherein the predetermined threshold is approximately 150° C.

12. The three-phase matched filter inductor of claim 9, wherein the film is a varnish.

* * * * *